PROCESS OF PREPARING THERMOELECTRIC ELEMENTS

Filed Feb. 29, 1960

WITNESSES
Edwin E. Bassler
Charles L. Menzemer

INVENTORS
Telesphore L. Charland &
Yung Tao
BY
Frederick Shapoe
ATTORNEY

United States Patent Office 3,182,391

Patented May 11, 1965

3,182,391

PROCESS OF PREPARING THERMOELECTRIC ELEMENTS

Telesphore L. Charland, Pittsburgh, Pa., and Yung Tao, Dallas, Tex., assignors to Westinghouse Electric Corporation, East Pittsburgh, Pa., a corporation of Pennsylvania Filed Feb. 29, 1960, Ser. No. 11,673
6 Claims. (Cl. 29—420.5)

This invention pertains to a new and improved process for the simultaneous preparation of a thermoelectric element with electrical contacts applied thereto by powder metallurgy procedures, and the improved thermoelectric elements so produced.

This application is a continuation-in-part of our copending application Serial No. 820,349, filed June 15, 1959, now abandoned and assigned to the same assignee.

A major problem in the building of thermoelectric devices is the bonding of metal contacts to the ends of the thermoelectric elements. According to the known prior art, one of two methods have been usually employed: (1) direct fusion, or (2) soldering.

In the direct fusion method, a bond is made between the thermoelectric element and the metal contact in a vacuum at the liquidus temperature of the thermoelectric element.

In soldering, a eutectic solder of the components of the thermoelectric element is placed between the metal contact and the element, and the assembly is heat treated in an inert atmosphere to achieve bonding between the contact and the element.

Both of these prior art methods described above usually rearrange the lattice structure of the thermoelectric element at the extremities thereof and thereby lower the thermoelectric efficiency or figure of merit of the element. Therefore they have not been entirely satisfactory.

A second shortcoming of these methods is that they require a two step process; (1) preparing or forming the element, and (2) attaching the electrical contact or contacts thereto.

An object of the present invention is to provide a one step process for the preparation and forming of a thermoelectric element by powder metallurgy techniques wherein the electrical contacts are simultaneously applied thereto.

Another object of the present invention is to provide a one step consolidating process for applying an electrical contact to a thermoelectric element which is being simultaneously formed from a powder without causing a decrease in the thermoelectric efficiency of the thermoelectric element.

Another object of the present invention is to provide a one step hot pressing process for chemically and mechanically bonding an electrical contact to a thermoelectric pellet being simultaneously prepared from powders without causing a decrease in the thermoelectric efficiency of the element.

Other objects of the present invention will, in part, appear hereinafter and will, in part, be obvious.

For a better understanding of the nature and objects of this invention, reference should be had to the following detailed description and drawings, in which.

In accordance with the present invention and attainment of the foregoing objects there is provided a one step process for forming a thermoelectric element with at least one metallic electric contact at one end thereof which comprises, consolidating under heat and pressure a body comprising a mass of particles of a thermoelectric composition into a pellet with electrical contacts disposed at each end of the pellet, whereby there is produced a unitary thermoelectric element having substantially the maximum thermoelectric efficiency for the given composition.

For purposes of clarity, this invention will be described in terms of preparing a zinc antimonide thermoelectric pellet and a bismuth telluride thermoelectric pellet, and the simultaneous application of electrical contacts bonded to the extremities thereof. It will be understood, however, that the teachings of this invention are applicable to the preparation and simultaneous application of contacts to thermoelectric elements comprised of other thermoelectric materials, particularly intermetallic compositions and oxides, that lend themselves to powder metallurgy techniques, for example, cadmium antimonide, indium antimonide-indium arsenide mixtures, germanium telluride, bismuth selenide, bismuth antimony telluride, lanthanum barium titanium oxide, germanium antimony telluride, sodium manganese telluride, manganese germanium telluride and the like.

Figure 1:
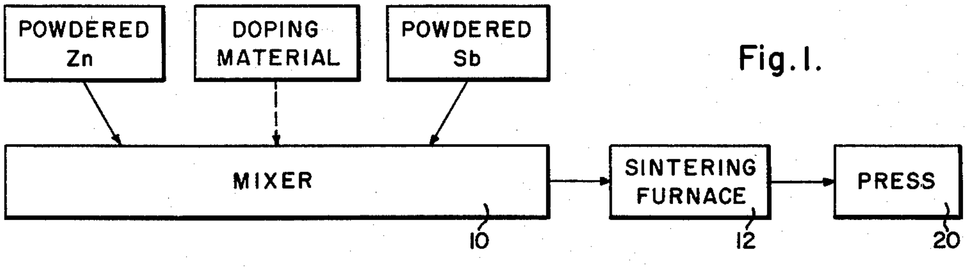
FIGURE 1 is a schematic view in diagrammatic form illustrating one process of this invention.

More specifically and with reference to FIG. 1, zinc and antimony in powdered form and in substantially stoichiometric portions, 33% to 36%, by weight, of zinc and 67% to 64%, by weight, of antimony are charged into a suitable mixer 10 and admixed to a state of homogeneity. For best results the powders are preferably of less than 200 mesh fineness (U.S. standard sieve).

The time necessary to ensure homogeneity of the mixture is dependent upon the quantity of materials being admixed and the size of the mixer used. The particle size of the zinc and antimony may vary from —200 mesh to —325 mesh (U.S. standard sieve). Very satisfactory results have been achieved employing particles having a particle size such that the majority of particles will pass through a 325 mesh sieve.

If it is desired to produce a doped thermoelectric element, a finely divided doping material such as silver, or other additive, such as tin dust, is charged into the mixer with the zinc and antimony.

Examples of suitable doping agents for zinc antimonide thermoelectric elements include at least one metal selected from the group consisting of aluminum, iron and silver. Other materials, for example tin, may be added to improve the physical properties of the element. The quantity of doping material or other additives employed will depend upon the thermoelectric properties desired. Silver is usually employed in quantities ranging from 0.1% to 0.5%, by weight, based on the weight of the components. Tin is usually employed in quantities ranging from 1% to 4%, by weight, based on the weight of the components. Particularly suitable zinc antimony thermoelectric elements have been prepared containing the following additives: (1) 2%, by weight, tin, (2) 0.5%, by weight, silver, and (3) 1%, by weight, tin and 0.1%, by weight, silver.

After admixing, the zinc-antimony powder admixture is charged into a sintering furnace 12 and sintered for from two hours to 15 hours in an inert atmosphere, for example, an argon, helium, or nitrogen atmosphere at a temperature of from 400° C. to 525° C. Particularly satisfactory thermoelectric elements have been prepared from admixtures sintered for 5 hours in an argon gas atmosphere at 500° C. The sintered material can be readily broken up into a loose powder if it is agglomerated into large particles or clumps. The sintered zinc antimony admixture in powdered form is now ready to be molded into a thermoelectric element having at least one metal electrical contact joined thereto.

Figure 2:
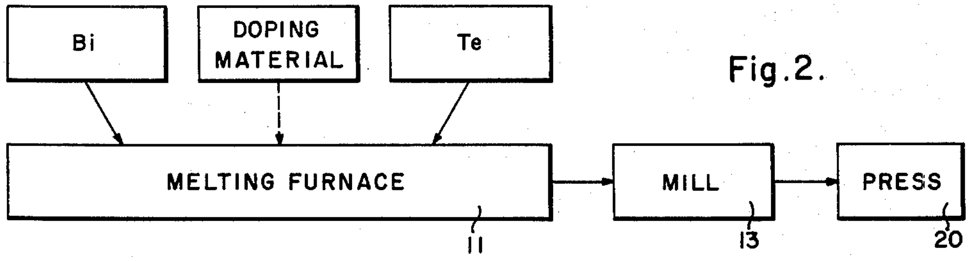
FIG. 2 is a schematic view in diagrammatic form illustrating a modification of the process of this invention.

In a modification of the material preparation portion of the process of this invention reference should be had to FIG. 2, the materials to be fabricated into a thermoelectric element, for example, bismuth and tellurium together with any desired doping material, are charged into a vessel comprised of an inert material, for example quartz, and the vessel evacuated to for example, a vacuum of from $10^{-2}$ mm. Hg to $10^{-5}$ mm. Hg, and the vessel sealed-off. The evacuated sealed-off vessel containing the bismuth and tellurium is then charged into a suitable melting furnace 11, for example an induction heating furnace, and the bismuth and tellurium melted and allowed to react at about 900° C., or at any temperature above the melting point of the bismuth and tellurium, for from 2 to 3 hours or more. The power to the furnace is then discontinued and the reacted bismuth telluride allowed to solidify into an ingot within the furnace.

The reacted bismuth telluride in ingot form is removed from the inert vessel and charged into a suitable mill 13 such as a ball mill. Within the mill 13 the bismuth telluride is crushed to at least —200 mesh fineness (U.S. standard sieve) and admixed to a state of homogeneity. It will be understood of course that the crushing and admixing may be carried out in separate operations. The time necessary to crush the bismuth telluride ingot and to achieve homogeneity is of course dependent on the size of the mixing mill and the quantity of material involved.

The bismuth telluride in powder form is now ready to be molded into a thermoelectric element having at least one metal electrical contact joined thereto.

The selection of either of the above processes by which the thermoelectric material is prepared for subsequent compaction and the affixing of contacts thereto, is dependent primarily upon the desired characteristics and the nature of the composition being processed. If the materials are admixed and reacted in powdered form and then sintered, phase transformation may be held to a minimum and the final properties of the material can be closely controlled. Materials combined and reacted in the molten state are generally found to be more pure than the materials admixed and reacted in the powder form, but phase transformation during melting may vary the final composition.

Figure 3:
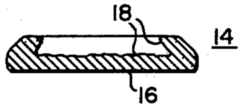
FIG. 3 is a view in cross section of one type of electrical contact suitable for use in accordance with the teaching of this invention.

With reference to FIG. 3, there is shown a metal contact 14 suitable for use in accordance with this invention. The metal contact 14 has a substantially smooth end surface 16 and an irregular reentrant inner surface 18. The smooth surface 16 is suitable for joining to other electrical members or for affixing other contacts to the element. The irregular inner surface 18 enables intimate chemical and physical bonding to enable electrical current to flow readily and with low voltage drop to a consolidated body of the thermoelectric material to which it is attached, such as zinc antimonide, bismuth telluride, cadmium antimonide-indium antimonide-indium arsenide, germanium telluride, bismuth selenide, bismuth antimony telluride, lanthanium barium titanium oxide, germanium antimony telluride, sodium manganese telluride, manganese germanium telluride and the like. It will be understood that the contact 14 having a reentrant inner surface is shown in its present configuration only as an example, and other irregular bottom configurations such as a cup shaped rim, a ribbed bottom, one or more short pin-like stems and the like may be employed individually or jointly. The contact 14 may be comprised of any suitable good conducting metal, for example, steel, especially cold rolled steel, stainless steel, copper clad steel, nickel clad steel, copper clad aluminum, silver, silver plated steel and the like.

Figure 4:
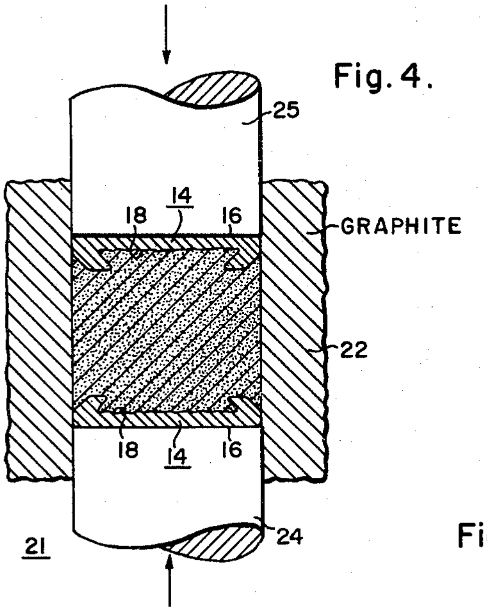
FIG. 4 is a view in cross section illustrating the molding operation of this invention.

With reference again to FIG. 4, there is illustrated details of the press shown only schematically in FIGS. 1 and 2, wherein metal contacts 14 and a quantity of the powdered sintered zinc antimonide or the powder derived from melt reacted bismuth telluride is charged into a cavity 21 of the hot press 20. The press 20 may comprise a plurality of cavities. The cavity 21 is formed in an inert metal, ceramic or graphite material. Graphite is preferred. As illustrated the cavity comprises, graphite wall 22 and steel compression punches or rods 24 and 25.

In the practice of the process of this invention, an electrical contact 14 is disposed in the cavity 21 with its smooth end surface 16 in contact with the lower compression rod 24. A selected quantity of the powdered thermoelectric composition is then charged into the cavity upon the irregular surface 18 of the contact 14. A second metal contact 14 disposed on top of the charge so that its irregular surface 18 is in contact with the mass of powdered thermoelectric material while its substantially smooth end surface 16 will be in contact with the upper compression rod 25. The thermoelectric material and the metal contacts are heated in the cavity 21 to raise their temperature within the range of from 450° C. to 520° C. for zinc antimonide and bismuth telluride and a pressure of from about 1,000 to 15,000 pounds per sq. in. is applied to the mass.

It will be further understood that the temperature and pressure at which the molding or pressing operation is carried out will depend upon the materials employed. Generally, however, the molding should be carried out at a temperature within a range of from 20° C. to 100° C. below the melting point of the thermoelement material proper and at a pressure sufficient to ensure coalescing and bonding of the material.

In actual practice it has been found economical to have the press cavity at a temperature approximately equal to the pressing temperature at the time the mass of thermoelectric material to be compressed is introduced. If the thermoelectric material is stable, it can be preheated to a temperature approximately equal to the pressing temperature. The temperature is then increased to the desired range and the pressing carried out. It will be understood, however, that the hot pressing operation may be initiated with the cavity and sintered mass relatively cold such as at room temperature.

Excellent thermoelectric elements with electrical contacts in intimate jointure therewith have been prepared using a temperature of 500° C. to 520° C. and 3500 pounds per sq. in. At the conclusion of the molding or pressing cycle the pressure is released and the molded thermoelectric element with electrical contacts intimately joined therewith is ejected from the mold.

It will be understood that while the invention has been described and set forth in terms of only one mold cavity, a multiple number of thermoelectric elements with their contacts in intimate jointure therewith may be molded at one time. It also should be understood that the cavity 21 may have a closed bottom and only one piston entering at the top.

The resulting thermoelectric elements comprise a consolidated body of thermoelectric composition bonded chemically and physically to contacts 14. The properties of the element are outstanding.

The thermoelectric element thus prepared is now ready for incorporation in a thermoelectric device.

Figure 5:
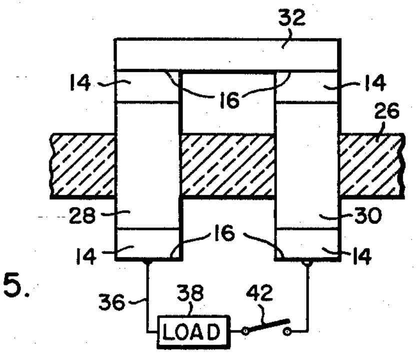
FIG. 5 is a view partially in cross section of a thermoelectric device incorporating thermoelectric elements prepared in accordance with the teaching of the invention.

With reference to FIG. 5 of the drawing, there is illustrated a thermoelectric device employing the thermoelement members of this invention suitable for producing electric current from heat. A thermally insulating wall 26 so formed as to provide a suitable furnace chamber is perforated to permit the passage therethrough of a positive zinc antimonide thermoelectric element 28 and a negative thermoelectric element 30 comprised of, for example, indium arsenide, and prepared in the same way as element 28. An electrical conducting strip of metal 32 comprised of, for example, copper, silver or the like, is joined to the smooth end face 16 of metal contact 14 of the element 28 and to smooth end face 16 of contact 14 of the element 30 within the chamber so as to provide good electrical and thermal contact therewith. If element is prepared by other processes and has no metal contact therein the end face thereof may be coated with a thin layer of metal, for example, by vacuum evaporation or by the use of ultrasonic brazing whereby good electrical contact is obtained between the negative element 30 and the metal strip 32. The metal strip 32 may be provided with suitable fins or other means for conducting heat thereto from the furnace chamber in which it is disposed.

At the other end of the element 28 is a second metal contact 14 to which an electrical conductor 36 is connected by brazing or the like. The electrical conductor 36 contains a load 38 and is connected to an electrical contact 14 on the n-type thermoelectric element 30. A switch 42 is disposed in the electrical conductor 36 so that the circuit may be opened or closed as desired. When the switch 42 is moved to the closed position and a temperature difference exists between strip 32 and the lower ends of elements 28 and 30, an electrical current will flow between members 28 and 30 and energize the load 38.

It will be appreciated that a plurality of pairs of the positive and negative members may be joined in series or in parallel, in order to produce a plurality of cooperating thermoelectric elements. Each of the pairs of joined thermoelements will be disposed with one junction in a furnace or exposed to any other source of heat while the other junction is cooled by applying water or blowing air thereon. Due to the relative difference in the temperature of the junctions, an electrical voltage will be generated in the thermoelements. By joining a plurality of the thermoelements in series direct current of any suitable voltage can be generated.

The following examples are illustrative of the practice of this invention and set forth the advantages thereof: all parts and percents are by weight unless otherwise indicated.

*Example I*

A composition of matter comprised of compactable particles having a particle size of less than 200 mesh and being made up of 34.6% zinc, 64.3% antimony, 1.0% tin and .1% silver was charged into a conical blender and admixed for approximately 2 hours to ensure homogeneity.

The admixture was then sintered in an argon atmosphere at a temperature of approximately 500° C. for approximately 5 hours.

A metal contact of the type illustrated in FIG. 3 comprised of nickel clad steel having a diameter of ½ inch and an over-all thickness of 0.030 inch was disposed in the bottom of a cavity in a hot press. The smooth surface of the contact was in contact with the upper surface of a bottom compression rod as illustrated in FIG. 3. Sufficient zinc antimony powder to form a consolidated ½ inch diameter by ½ inch long thermoelectric element was introduced into the cavity of the hot press and a second metal contact identical to the first was disposed on top of the metal powder in such a way that its relatively smooth end surface would contact the surface of the compression rod.

The compression rods were then positioned in the mold cavity and the entire assembly heated to a temperature of 520° C. while a pressure of 5000 pounds per sq. in. was exerted and maintained for 45 minutes. Thereby a zinc antimonide thermoelectric element having a metal contact intimately joined at each of its axial ends was produced.

*Example II*

The procedure of Example I was repeated using metal contacts comprised of (1) copper clad steel, (2) hot rolled steel, (3) stainless steel and (4) cold rolled steel, respectively, and a series of equally satisfactory thermoelements was prepared in each case.

*Example III*

A zinc antimonide thermoelement was prepared and molded in exactly the same method set forth in Example I except electrical contacts were not present in the hot press. After the thermoelectric element was formed, steel contacts were soldered to the axial ends of the thermoelectric element with a zinc antimony eutectic solder.

*Example IV*

41.8 grams of bismuth and 38.2 grams of tellurium were charged into a quartz bulb. The bulb was evacuated to an absolute pressure of $10^{-4}$ mm. Hg and sealed off.

The bulb was charged into an induction heating furnace and the bismuth and tellurium were heated to, and maintained at, a temperature of 900° C. for approximately 2.5 hours. During the heating the bismuth and tellurium melted and reacted to form bismuth telluride ($Bi_2Te_3$). The power to furnace was then discontinued and the molten bismuth telluride allowed to solidify, in ingot form, at the cooling rate of the furnace. The bismuth telluride ingot was removed from the quartz and crushed, with a mortar and pestle to a particle size of −200 mesh (U.S. standard sieve). The particles of bismuth telluride were then charged into a conical blender and admixed for about 2 hours to ensure homogeneity.

The blended bismuth telluride particles were then consolidated by hot pressing into thermoelectric pellets ½ inch in diameter and ½ inch long with nickel clad steel contacts affixed at opposite ends thereof in accordance with the procedure of Example I.

The thermoelectric properties of the pellets of Examples I, II, III and IV were determined and are set forth in tabular form below.

THERMOELECTRIC EFFICIENCY OF THERMOELECTRIC ELEMENTS WITH CONTACTS

| Thermoelectric Material | Contact Material | Method of Joining (Contact-Element) | Thermal Conductivity, watts/cm. ° C. (K) | Resistivity, ohm-cm. (P) | Seebeck Coef., microvolts/° C. (α) | Figure of Merit (M), percent |
|---|---|---|---|---|---|---|
| ZnSb | Nickel Clad Steel | Molding | 0.021 | 0.0028 | 192 | [1] 11.1 |
| ZnSb | Cold Rolled Steel | do | 0.0214 | 0.0031 | 206 | [1] 11.69 |
| ZnSb | Copper Clad Steel | do | 0.031 | 0.0021 | 181 | [1] 8.90 |
| ZnSb | Nickel Clad Steel | Soldering | 0.0333 | 0.00207 | 175 | [1] 7.42 |
| ZnSb | Cold Rolled Steel | Fusion | 0.033 | 0.0021 | 179.2 | [1] 7.74 |
| $Bi_2Te_3$ | Nickel Clad Steel | Molding | 0.0211 | 0.00246 | 146.5 | [2] 5.63 |

[1] Th=Hot Junction Temperature (450° C.).
[2] Th=Hot Junction Temperature (253° C.).

$$M=\frac{Th}{4}\frac{\alpha^2}{\rho k}.$$

From the electrical properties set forth above, it can clearly be seen that an increase in the figure of merit or thermoelectric efficiency results from the practice of the teaching of this invention.

In addition to increasing the figure of merit of the thermoelectric element the practice of this invention reduces the steps in the process of forming a thermoelectric element and attaching electrical contacts thereto from a two step process (i.e., forming the pellet and then joining the contacts thereto) to a one step operation.

While the invention has been described with reference to particular embodiments and examples, it will be understood that modifications, substitutions and the like may be made therein without departing from its scope.

We claim as our invention:

1. A process for forming in one step a thermoelectric element with a metallic electrical contact at one end thereof which comprises, consolidating, within a die cavity, a mass of particles consisting exclusively of at least one thermoelectric composition selected from the group consisting of cadmium antimonide, indium antimonide, indium arsenide, germanium telluride, bismuth selenide, bismuth antimony telluride, lanthanum barium titanium oxide, germanium antimony telluride, sodium manganese telluride, manganese germanium telluride and mixtures thereof, under a pressure of from 1000 to 15,000 p.s.i., while heated to a temperature of from 20° C. to 100° C. below the melting point of the composition, without the use of any bonding material, while in contact with a metal electrical contact plate at at least one end thereof to produce a compact body with the at least one aforesaid metal electrical contact bonded at the end of the body.

2. A process for forming a thermoelectric element which comprises (1) preparing a mass of finely divided particles consisting exclusively of an intermetallic thermoelectric composition selected from the group consisting of cadmium antimonide, indium antimonide, indium arsenide, germanium telluride, bismuth selenide, bismuth antimony telluride, lanthanum barium titanium oxide, germanium antimony telluride, sodium manganese telluride, manganese germanium telluride and mixtures thereof, formed in the molten state, solidified and subdivided mechanically to a size of below 200 mesh, and (2) uniting said finely divided intermetallic particles with at least one metallic electrical contact by applying the metallic contact to one end of the mass and consolidating the whole into an integral structure by molding under a pressure within the range of from 1000 p.s.i. to 15,000 p.s.i. at a temperature of from 20° C. to 100° C. below the melting temperature of the composition, without the use of any bonding material.

3. A process for forming a thermoelectric element which comprises (1) preparing a molten alloy of an intermetallic thermoelectric compound selected from the group consisting of cadmium antimonide, indium antimonide, indium arsenide, germanium telluride, bismuth selenide, bismuth antimony telluride, lanthanum barium titanium oxide, germanium antimony telluride, sodium manganese telluride, manganese germanium telluride and mixtures thereof, (2) solidifying the alloy, (3) dividing the solidified alloy into finely divided particles having a particle size of less than —200 mesh, (4) uniting a mass consisting exclusively of said finely divided intermetallic particles with at least one electrical contact applied to one end of the mass by consolidating the whole into an integral structure by molding under a pressure within the range of from 1000 p.s.i. to 15,000 p.s.i. at a temperature of from 20° C. to 100° C. below the melting temperature of the thermoelectric composition without the use of any bonding material.

4. A process for forming a thermoelectric element which comprises (1) preparing a sintered mass of particles comprising the reaction product of substantially stoichiometric proportions of finely divided zinc and finely divided antimony, and (2) uniting said sintered mass of particles, without the use of any bonding materials, with a pair of electrical contacts by consolidating the whole into an integral structure by molding at a pressure of 5000 p.s.i. and a temperature of 520° C.

5. A process for preparing a zinc antimony thermoelectric element comprising (1) admixing substantially stoichiometric amounts of zinc and antimony in powder form, (2) sintering the admixture in an inert atmosphere at a temperature of from 400° C. to 525° C. for from 2 hours to 15 hours to produce an intermetallic compound and (3) uniting only a mass of sintered particles, without the use of any bonding materials, with a pair of electrical contacts applied to the ends of the mass by consolidating the whole into an integral structure by molding at a pressure of from 1000 p.s.i. to 15,000 p.s.i. at a temperature of from 450° C. to 520° C.

6. A process for forming a thermoelectric element which comprises (1) preparing a molten alloy comprised of bismuth and tellurium in a mol ratio of bismuth to tellurium: 2 to 3, (2) reacting the bismuth and tellurium for at least 2 hours in an inert vessel and under a vacuum to form bismuth telluride, (3) solidifying the bismuth telluride alloy, (4) dividing the bismuth telluride into finely divided compactable powder form, and (5) uniting a body consisting exclusively of said finely divided particles of bismuth telluride, without the use of any bonding materials, with at least one electrical contact by consolidating the whole into an integral structure by molding under a pressure within the range of from 1000 p.s.i. to 15,000 p.s.i. at a temperature within the range of from 450° C. to 520° C.

References Cited by the Examiner

UNITED STATES PATENTS

| | | | |
|---|---|---|---|
| 1,904,568 | 4/33 | Taylor. | |
| 2,018,073 | 10/35 | Laise | 200—166 |
| 2,056,919 | 10/36 | Casper | 200—166 |
| 2,161,597 | 6/39 | Swartz. | |
| 2,229,482 | 1/41 | Telkes | 136—5 |
| 2,289,570 | 7/42 | Boegehold. | |
| 2,506,327 | 5/50 | Harrington | 29—191.2 X |
| 2,694,126 | 11/54 | Binstock | 29—155.55 |
| 2,756,492 | 7/56 | Pettibone | 29—420.5 |
| 2,762,857 | 9/56 | Lindenblad | 136—5 |
| 2,811,571 | 10/57 | Fritts et al. | 136—5 |
| 2,913,819 | 11/59 | Andreotti et al. | 29—420.5 |
| 2,953,617 | 9/60 | Heikes et al. | 136—5 |
| 3,000,092 | 9/61 | Scuro | 29—472.9 |
| 3,034,202 | 5/62 | Graves | 29—155.55 |
| 3,086,068 | 4/63 | Charland et al. | 136—5 |
| 3,129,117 | 4/64 | Harding | 75—214 X |

OTHER REFERENCES

"Treatise on Powder Metallurgy," vol. I, Goetzel, 1949, pp. 39–42.

JOHN F. CAMPBELL, *Primary Examiner.*

WHITMORE A. WILTZ, *Examiner.*